US008816325B2

(12) United States Patent
Schenkel et al.

(10) Patent No.: US 8,816,325 B2
(45) Date of Patent: Aug. 26, 2014

(54) SCALABLE QUANTUM COMPUTER ARCHITECTURE WITH COUPLED DONOR-QUANTUM DOT QUBITS

(71) Applicant: The Regents of the University of California, Oakland, CA (US)

(72) Inventors: Thomas Schenkel, San Francisco, CA (US); Cheuk Chi Lo, Berkeley, CA (US); Christoph Weis, Berkeley, CA (US); Stephen Lyon, Cranbury, NJ (US); Alexei Tyryshkin, Yardley, PA (US); Jeffrey Bokor, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/645,291

(22) Filed: Oct. 4, 2012

(65) Prior Publication Data

US 2013/0087766 A1 Apr. 11, 2013

Related U.S. Application Data

(60) Provisional application No. 61/544,821, filed on Oct. 7, 2011.

(51) Int. Cl.
*H01L 29/06* (2006.01)

(52) U.S. Cl.
USPC .................. 257/14; 257/15; 257/17; 257/24; 257/E29.168

(58) Field of Classification Search
CPC .................. H01L 29/66984; H01L 29/66977; B82Y 10/00; B82Y 20/00; Y10S 977/933
USPC ............ 257/9, 14–15, 17, 20–21, 24–25, 27, 257/29, 38, 40, 288, 291, E29.168, E45.005
See application file for complete search history.

(56) References Cited

U.S. PATENT DOCUMENTS

| 6,369,404 | B1 * | 4/2002 | Kane .............................. 257/14 |
| 6,455,872 | B1 * | 9/2002 | Williams et al. ................ 257/14 |
| 6,787,794 | B2 * | 9/2004 | Cain et al. ...................... 257/20 |
| 7,126,139 | B2 | 10/2006 | Schenkel et al. |
| 8,148,715 | B2 * | 4/2012 | Hollenberg et al. ............ 257/14 |

OTHER PUBLICATIONS

Batra, et al., Appl. Phys. Lett. 91, 193502 (2007).
C. D. Weis, et al., J. Vac. Sci. Tech. B 26, 2596 (2008).

(Continued)

*Primary Examiner* — Dung A. Le
(74) *Attorney, Agent, or Firm* — Lawrence Berkeley National Laboratory

(57) ABSTRACT

A quantum bit computing architecture includes a plurality of single spin memory donor atoms embedded in a semiconductor layer, a plurality of quantum dots arranged with the semiconductor layer and aligned with the donor atoms, wherein a first voltage applied across at least one pair of the aligned quantum dot and donor atom controls a donor-quantum dot coupling. A method of performing quantum computing in a scalable architecture quantum computing apparatus includes arranging a pattern of single spin memory donor atoms in a semiconductor layer, forming a plurality of quantum dots arranged with the semiconductor layer and aligned with the donor atoms, applying a first voltage across at least one aligned pair of a quantum dot and donor atom to control a donor-quantum dot coupling, and applying a second voltage between one or more quantum dots to control a Heisenberg exchange J coupling between quantum dots and to cause transport of a single spin polarized electron between quantum dots.

17 Claims, 1 Drawing Sheet

(56) References Cited

OTHER PUBLICATIONS

T. Schenkel, et al., Nucl. Instr. Meth. B 267, 2563 (2009).
C. C. Lo, et al., Semicond. Sci. Technol. 24, 105022 (2009).
Loss and DiVincenzo, Phys. Rev. A 57, 120 (1998).
S. Shankar, et al., Phys. Rev. B 82, 195323 (2010).
Petta, et al., Science 309, 5744 (2005).
C. D. Weis, et al., Nucl. Instr. Meth. B 267, 1222 (2009).
MoberlyChan, et al. MRS Bulletin, 32, 424 (2007).
C.D. Weis, American Physical Society, APS Mar. Meeting 2012, Mar. 1, 2012, abstract #X29.006.
Kane, B.E, A silicon-based nuclear spin quantum computer. Nature, 1998. 393(6681): p. 133-137.
Morton, J.J.L., et al., Solid-state quantum memory using the P-31 nuclear spin. Nature, 2008. 455(7216): p. 1085-1088.
Alexei M. Tyryshkin, S.T., John J. L. Morton, Helge Riemann, Nikolai V. Abrosimov, Peter Becker, Hans-Joachim Pohl, Thomas Schenkel, Michael L. W. Thewalt, Kohei M. Itoh, and S. A. Lyon Electron spin coherence exceeding seconds in high purity silicon. arXiv:1105.3772, 2011.
Skinner, A.J., M.E. Davenport, and B.E. Kane, Hydrogenic spin quantum computing in silicon: A digital approach. Physical Review Letters, 2003. 90(8): p. 4.
Vrijen, R., et al., Electron-spin-resonance transistors for quantum computing in silicon-germanium heterostructures. Physical Review A, 2000. 62(1): p. art. no.-012306.
de Sousa, R., J.D. Delgado, and S. Das Sarma, Silicon quantum computation based on magnetic dipolar coupling. Physical Review A, 2004. 70(5): p. 6.
Hill, C.D., et al., Global control and fast solid-state donor electron spin quantum computing. Physical Review B, 2005. 72(4): p. 9.
DiVincenzo, D.P., The physical implementation of quantum computation. Fortschritte Der Physik-Progress of Physics, 2000. 48(9-11): p. 771-783.
Young, K.C., et al., Optimal quantum multiparameter estimation and application to dipole- and exchange-coupled qubits. Physical Review A, 2009. 79(6): p. 12.
Copsey, D., et al., Toward a scalable, silicon-based quantum computing architecture. Ieee Journal of Selected Topics in Quantum Electronics, 2003. 9(6): p. 1552-1569.
Rahman, R., et al., Atomistic simulations of adiabatic coherent electron transport in triple donor systems. Physical Review B, 2009. 80(3): p. 7.
Smelyanskiy, V.N., A.G. Petukhov, and V.V. Osipov, Quantum computing on long-lived donor states of Li in Si. Physical Review B, 2005. 72(8): p. 4.
O. O. Soykal, R.R., Charles Tahan Phononitons as a sound-based analogue of cavity quantum electrodynamics. arXiv:1106.1654, 2011.
Buluta, I., Ashhab, S., Franco, N. , Natural and artificial atoms for quantum computation. Rep. Prog. Phys. , 2011. p. 104401.
Childress, L., A.S. Sorensen, and M.D. Lukin, Mesoscopic cavity quantum electrodynamics with quantum dots. Physical Review A, 2004. 69(4): p. 8.
Hanson, R., et al., Spins in few-electron quantum dots. Reviews of Modern Physics, 2007. 79(4): p. 1217-1265.
Morton, J.J.L., A silicon-based cluster state quantum computer. arXiv0905.4008, 2009.
Morello, A., et al., Single-shot readout of an electron spin in silicon. Nature 467, 687 (2010).
Oh, S., et al., Heisenberg spin bus as a robust transmission line for quantum-state transfer. Physical Review A 84, 022330 (2011).
Abanto, M., et al., Quantum computation with doped silicon cavities. Physical Review B 81, 085325 (2010).
Morton, J.J.L., et al., Hybrid Solid-State Qubits: The Powerful Role of Electron Spins. Annual Review of Condensed Matter Physics 2, 189-212 (2011).
Simmons, C.B., et al., Tunable Spin Loading and T1 of a Silicon Spin Qubit Measured by Single-Shot Readout. Physical Review Letters 106, 156804 (2011).
Xiao, M., et al., Measurement of the Spin Relaxation Time of Single Electrons in a Silicon Metal-Oxide-SemiconductorBased Quantum Dot. Physical Review Letters 104, 096801 (2010).
Borselli, M.G., et al., Pauli spin blockade in undoped Si/SiGe two-electron double quantum dots. Applied Physics Letters 99, 063109 (2011).
Lu, T.M., et al., Enhancement-mode buried strained silicon channel quantum dot with tunable lateral geometry. Applied Physics Letters 99, 043101 (2011).
T. Schenkel, C. C. Lo, C. D. Weis, J. Bokor, A. M. Tyryshkin, S. A. Lyon, A spin quantum bit architecture with coupled donors and quantum dots in silicon, arXiv:1110.2228, Oct. 10, 2011.

* cited by examiner

SCALABLE QUANTUM COMPUTER ARCHITECTURE WITH COUPLED DONOR-QUANTUM DOT QUBITS

CROSS-REFERENCE TO RELATED APPLICATION(S)

This application claims the benefit of U.S. Provisional Patent Application No. 61/544,821, entitled "Scalable Quantum Computer Architecture with Coupled Donor-Quantum Dot Qubits," filed on Oct. 7, 2011, which is expressly incorporated by reference herein in its entirety.

STATEMENT REGARDING FEDERALLY SPONSORED RESEARCH OR DEVELOPMENT

This invention was made with government support under Contract No. DE-AC02-05CH11231 awarded by the United States Department of Energy to The Regents of the University of California for management and operation of the Lawrence Berkeley National Laboratory. This invention was also made with U.S. Government support under the National Security Agency Contract No. 100000080295. The government has certain rights in this invention.

BACKGROUND

1. Field

The present disclosure relates to quantum computing and, more particularly, to scalable computing architectures with coupled donor-quantum dot qubits.

2. Description of Related Art

Electron and nuclear spins of donors in silicon have long been recognized as promising qubit candidates. In isotopically purified $^{28}$Si they exhibit long coherence times on the order of seconds and their integration can benefit from the great fabrication finesse of silicon nanotechnology. Several concepts for scalable quantum computer architectures with donor spin qubits have emerged. In one proposed aspect of quantum computing (QC), quantum information may be stored in the nuclear spin of phosphorus atoms. Electrostatic gates facilitate transfer of quantum information from nuclear to electron spins and between electron spins, by modulating the contact hyperfine interaction (A-gates), and the Heisenberg exchange coupling (J-gates), respectively. Recently, reliable detection of single electron spins and the control of single electron and nuclear spin states has been observed. For the development of a large scale quantum computer, elements of quantum memory, quantum logic and efficient quantum communication channels may be integrated. While single donor electron and nuclear spin readout and control have been demonstrated, the mastering of spin qubit coupling so that two and multiqubit logic operations can be implemented is still needed. In early concepts of donor qubits, coupling was envisioned along 1D chains of nearest neighbor coupled qubits. While this may suffice for two or three qubit logic demonstrations, severe limitations of nearest neighbor coupling have been noted. Coherent shuttling of electrons between donors has been proposed as a path to circumvent the nearest neighbor coupling challenges or supplement nearest neighbor coupling with a longer range coupling option. For electron shuttling, two important aspects include spin coherence of donor electron and nuclear spins during cycles of ionization and recombination. Other potential paths for long range transport of quantum information from donor spins include concepts of a spin bus, virtual phonon mediated coupling, coupling via nano-mechanical resonators and spin-to-photon coupling in optical cavities or via high Q microwave resonators.

In parallel to single donor spin control, control of electron spins in silicon and Si—Ge based quantum dots has developed. Here, quantum information can be encoded, e. g., in the spin state of a coupled pair of electrons in a double quantum dot structure. For spin based quantum computers with donors, the nuclear spin represents a promising mode for quantum memory. Electrons of donors and dots allow fast single qubit operation and nearest neighbor two-qubit interactions through controlled exchange coupling. Cluster state quantum computer approaches offer an alternative approach e. g. with nuclear spin memory that "only" require nearest neighbor interactions and reliable single qubit control and readout.

SUMMARY

Disclosed is a quantum computer architecture where donor nuclear spins are coupled via donor electron spins to spins of electrons in quantum dots, enabling further coupling, e. g., to high Q resonators for quantum communication or enabling cluster state QC implementations without need for donor ionization and coherent recombination. Practical implementation of such a donor-dot architecture may be considered, i. e., fabrication of back gated, vertical aligned quantum dots-to single donors in a semiconductor layer that may be isotopically purified $^{28}$Si, a Si—Ge heterostructure, or the like, which may be epitaxially grown.

In an aspect of the disclosure, a quantum bit computing architecture includes a substrate, a buried oxide layer on the substrate, a semiconductor layer on the buried oxide layer, a dielectric insulator on the semiconductor layer, one or more spin memory donor atoms embedded in the semiconductor layer, and a quantum dot embedded in the semiconductor layer above and aligned with each of the donor atoms. A one or more top gate electrodes above and adjacent to the dielectric layer are aligned to control the quantum dots. A back gate opposite the one or more donor atoms and adjacent to the buried oxide are provided, wherein a voltage applied between the top gates and the back gates controls the donor-quantum dot coupling.

DETAILED DESCRIPTION

Figure 1:
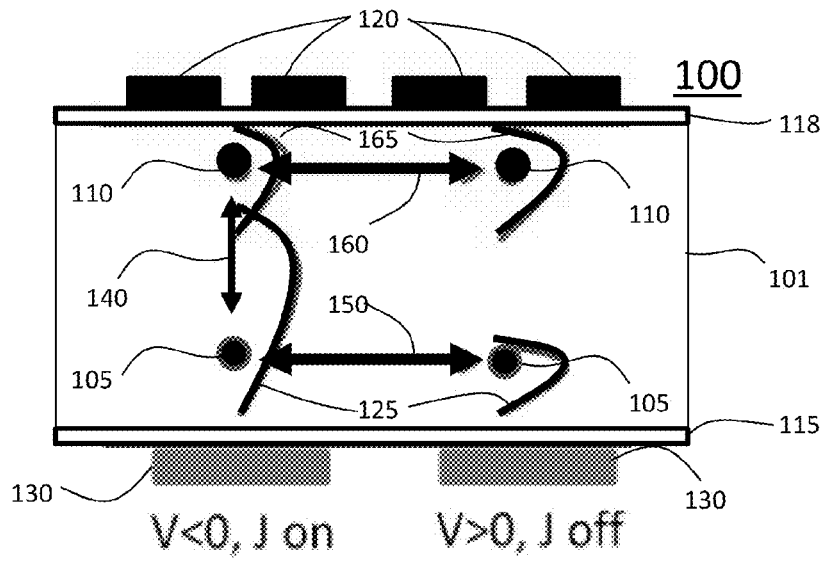
FIG. 1 shows, in an aspect of the disclosure, a schematic of a spin qubit architecture.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element. In addition, when a first element is "coupled" to a second element, the first element may be directly connected to the second element or the first element may be indirectly connected to the second element with intervening elements between the first and second elements.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can therefore encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

The scalable quantum computer architecture based on coupled donor-quantum dot Qubits relies on integration of several modules and interaction processes: a single donor nuclear spin memory coupled to the donor electron spin through the contact hyperfine interaction for storage and retrieval of quantum information, where the donor electron spin couples to the spin of an electron in a vertically aligned quantum dot, with a voltage gate controlling the exchange coupling. In effect, electron spins in quantum dots are coupled to a nuclear spin memory. Readout of quantum information can be performed on either the donor or quantum dot electron spins, e. g., through spin dependent tunneling. Single qubit operations can be performed on the donor electron spin and on the dot electron spin with pulsed microwaves, which can be delivered locally or globally by placing devices into microwave cavities. Two qubit operations can be implemented between spins of donor and dot electrons and on electron spins of adjacent dots. Here, a large enough magnetic field (e.g., >10 mG/nm) may be applied to detune the spin resonance lines for adjacent donor-dot devices, e. g., through the presence of micro-magnets or local inductors.

FIG. 1 shows a schematic of a spin qubit architecture 100 with vertically coupled donors 105 and quantum dots 110 formed, e. g., in SOI (silicon 101 on insulator) where the insulator is a thin buried oxide 115 (box). The box 115 may be, for example, $SiO_2$, $Al_2O_3$, or the like. Top gates 120 on a high quality dielectric layer 118 define quantum dots with single electron occupancy control in the semiconductor layer 101. Quantum dots 110 are aligned to donors 105 ~20 to 30 nm below the quantum dots. Local back gates 130 below the buried oxide layer allow tuning of the donor-dot exchange coupling 140 and control electron transfer between a dot and a donor atom. The donor-donor distances may be about ~100 nm, large enough to avoid spurious direct donor-donor coupling 150, while Heisenberg exchange (J coupling) and charge transfer coupling 160 between dots may be gate controlled.

The quantum computer architecture includes integrating the following modules and interactions: a single donor nuclear spin memory coupled to the donor electron spin through the contact hyperfine interaction for storage and retrieval of quantum information, wherein the donor electron spin couples to the spin of an electron in a vertically aligned quantum dot, with a gate controlled exchange coupling.

A voltage V is applied between a back gate 130 beneath the donor and one or more of the top gates 120 above an aligned pair of donor 105 and quantum dot 110. The voltage alters the overlap of the donor electron wave function 125 and quantum dot electron spin wave function 165, and therefore controls the exchange coupling.

Figure 2:
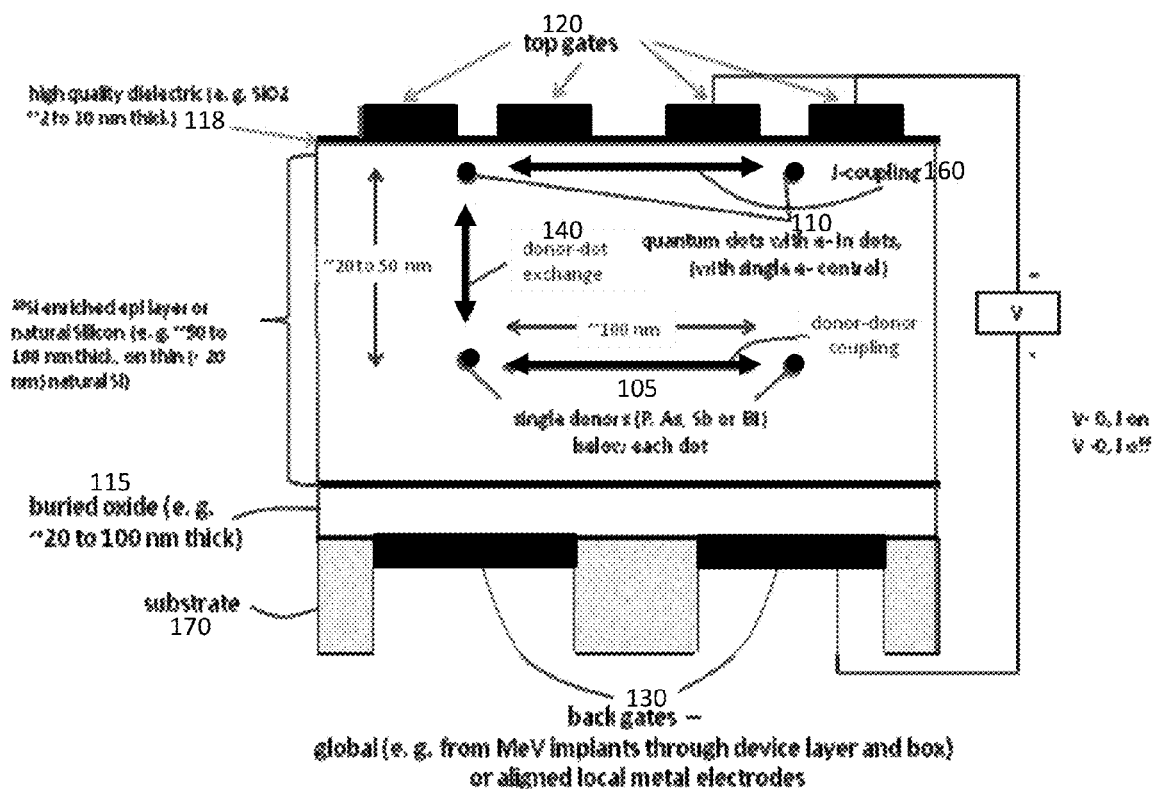
FIG. 2 shows, in an aspect of the disclosure, a more detailed schematic of a spin qubit architecture.

FIG. 2 shows FIG. 1 with more detail. In an embodiment, the entire architecture, including top gates 120, dielectric layer 118, silicon 101 on box 115, embedded single atom donors 105, are formed on a substrate 170, such as, for example, silicon. Back gates 130 may be formed, for example, by etching vias in the silicon substrate 170, followed by deposition of conductive electrodes.

Further integration for mid and long range quantum communication through electron shuttling between dots or coupling to superconducting resonators is possible by combining all three critical architecture elements of quantum memory, logic and communication.

An alternative approach of cluster state quantum computing may also be implemented without the need for cycles of coherent donor ionization and recombination. Ionizing the donor protects the nuclear spin from de-coherence through uncontrolled interaction with the donor electron, if coherence can be preserved in the recombination step that is necessary to retrieve the quantum information from the nuclear spin and transfer it back to the donor electron spin for further processing. Inter-dot coupling can effectively entangle donor nuclear spins and enable implementation of cluster state quantum computing.

While key elements of this donor-dot architecture have been experimentally tested—at least in ensemble measurements—challenges remain, e.g., efficient quantum information transfer between donor electron and nuclear spins has been demonstrated with ensembles of phosphorus donors in $^{28}Si$. Also, quantum dots with a high degree of control have also been demonstrated in silicon and Si—SiGe hetero-structures, i.e. in a materials system that can be prepared with minimal nuclear spin background. Further, these nuclear spin free matrixes can be prepared on insulator layers, enabling back gating of devices in SOI (silicon on insulator, including $^{28}$SOI) and SGOI (Silicon-Germanium on insulator).

Device integration of donors in a transistor paradigm, e. g. with local gate control of single and two qubit interactions, requires integration with electrodes, which can be isolated from the matrix with thin dielectrics. The underlying physical mechanisms at the Si—SiO$_2$ interface appear to limit coherence of donor electron spins and are not well understood. However, ion implanted antimony (Sb) shows promise as a nuclear spin donor. Even at a few tens of ms, the antimony nuclear spin near the Si—SiO$_2$ interface makes an attractive quantum memory, provided that reliable quantum information transfer between the donor electron and nuclear spin is accomplished at least 10$^4$ times faster to enable application of error correction schemes.

When donor electrons are exposed to conduction electrons, e. g. from a two dimensional electron gas (2DEG) in the channel of a field effect transistor, spin coherence times can be expected to be even shorter than in the presence of an SiO$_2$ interface only. The quality of the SiO$_2$—Si interface is of critical importance, especially also quantum dots, both for electron spin coherence and for control of single electron dot occupancy. While it can be expected that the coherence limiting noise source, such as magnetic fluctuators at the interface, will freeze out to some degree at lower temperatures, it is clear that interface quality is a critical factor for both donor and quantum dot electron spin qubit integration. Hydrogen passivated silicon provides the highest quality interface with the longest electron spin coherence times of nearby donors but technical challenges exist to integrate it with 20 to 50 nm scale top gates and e. g. a ~10 nm scale vacuum gap.

A promising substrate for donor-dot device fabrication may be $^{28}$SOI, i.e., silicon on insulator where a $^{28}$Si enriched epi-layer is grown on a thin natural silicon device layer. Top gates formed by standard e-beam lithography may define quantum dots. Careful annealing re-oxidation steps are required to enhance the oxide quality.

Single ions can be implanted into double quantum dot devices. Gate electrodes are formed from metals that can sustain the required post-implantation anneals. Back gate formation may require back etching of the silicon substrate to the box and lithography on the back side. Alignment to features on the top can be achieved with common vias through the device layer and box.

For donor spin qubit applications, implant energies have to be selected so that placement uncertainties from range straggling are within tolerances set by the qubit architecture. For a quantum computer model with nearest neighbor coupling of donors spaced 10 to 20 nm apart, this control of donor placement by ion implantation is important. For ion implantation, the position accuracy is limited by three factors: range straggling, ion beam spot size and diffusion during annealing.

Range straggling results from statistical energy loss process in the gradual slow down of ions in the target matrix. Range straggling is reduced for lower ion implantation energies and is reduced for higher projectile mass in a given target matrix. E.g., for implantation of group V donors into silicon, straggling is highest for phosphorus (P), intermediate for arsenic (As) and lowest for bismuth (Bi) donors.

The required control of donor depth below a quantum dot is stringent and is given by limits of the tunability of the exchange coupling between donors and an electron in a quantum dot. The characteristic length scale for (Heisenberg exchange) J coupling is set by the extent of the dot electron wave function, which is set by the confinement potential and is ~5 to 10 nm in typical top gated quantum dots, similar to the extent of 2DEG's in field effect transistors. For donors, Bohr radii range from ~1.8 nm in P and Sb to 1.5 nm in Bi. J coupling between an electron in a dot and an electron on a donor below the dot can be tuned to have appreciable strengths needed for fast and precise exchange gate execution for distances of ~20 to 40 nm. The requirement for gate execution time is set by the applicability of quantum error correction codes at a given gate fidelity and electron spin coherence time. For dot electron spin coherences times of a few tens of µs gates should preferably execute within a few ns, requiring J>10 µeV. Both top and back gates can be tuned to displace both the donor and dot electron wave functions in order to turn exchange coupling on and off. The donor depth must be controlled within the J-tuning range and ion implantation of donors into a depth of ~25 nm with a FWHM of 20 nm may enable this with high yield. A 60 keV Sb implant from has a FWHM of ~33 nm, and 60% of donors would be placed in a 30 nm wide depth window from 10 to 40 nm below a quantum dot. Using Bismuth, range straggling is further reduced.

Donor placement tolerances in a coupled donor-quantum dot architecture are relaxed compared to requirements for nearest neighbor donor-donor coupling or coupling along a donor chain.

The various aspects of this disclosure are provided to enable one of ordinary skill in the art to practice the present invention. Modifications to various aspects of forming quantum memory, quantum logic and quantum communications channels presented throughout this disclosure will be readily apparent to those skilled in the art of quantum structures and nuclear spin physics, applications to other technical arts, and the concepts disclosed herein may be extended to such other applications. Thus, the claims are not intended to be limited to the various aspects of a quantum bit computing architecture presented throughout this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A quantum bit computing apparatus comprising:
   a semiconductor layer;
   a plurality of donor atoms embedded in the semiconductor layer, the plurality of donor atoms being single spin memory donor atoms; and
   a plurality of quantum dots arranged with the semiconductor layer, each of the plurality of quantum dots aligned with each of plurality of donor atoms to form a plurality of pairs, each pair including a donor atom and a quantum dot, wherein a first voltage is configured to be applied across a first pair of the plurality of pairs to control a coupling between a first donor atom and a first quantum dot of the first pair.

2. The apparatus of claim 1, further comprising:
   a first dielectric layer disposed on a first surface of the semiconductor layer; and a plurality of top gate electrodes arranged on the first dielectric layer, each the plurality of top gate electrodes defining a location of each of the plurality of pairs.

3. The apparatus of claim 2, further comprising:
a second dielectric layer disposed on a second surface of the semiconductor layer; and
one or more back gate electrodes arranged on the second dielectric layer.

4. The apparatus of claim 3, further comprising a substrate, wherein the one or more back gate electrodes, the second dielectric layer, the semiconductor layer, the first dielectric layer, and the plurality of top electrodes are formed on the substrate.

5. The apparatus of claim 3, wherein the first voltage is configured to be applied across a first back gate electrode of the one or more back gate electrodes and a first top gate electrode of the plurality of top gate electrodes, wherein the first back gate electrode and the top gate electrode are associated with the first pair.

6. The apparatus of claim 1, wherein a donor atom-quantum dot spin exchange occurs when the first voltage has a first polarity.

7. The apparatus of claim 6, wherein a donor atom-quantum dot spin exchange does not occur when the first voltage has a second polarity opposite to the first polarity.

8. The apparatus of claim 3, wherein a second voltage applied is configured to be applied between one or more top gate electrodes, and wherein the second voltage is configured to control a Heisenberg exchange J coupling between quantum dots of the plurality of quantum dots or configured to control transport of a single spin polarized electron between quantum dots of the plurality of quantum dots.

9. The apparatus of claim 1, wherein the semiconductor layer is an epitaxially grown semiconductor layer.

10. The apparatus of claim 1, wherein the semiconductor layer is at least one of $^{28}$Si and a Si—Ge heterostructure.

11. The apparatus of claim 1, wherein the plurality of donor atoms comprises at least one of phosphorous, arsenic, antimony, and bismuth.

12. The apparatus of claim 1, wherein a separation between a donor atom of the plurality of donor atoms and a quantum dot of the plurality of quantum dots is about 10 nanometers to 30 nanometers.

13. The apparatus of claim 1, wherein each of the plurality of donor atoms are spaced about 100 nanometers or more apart.

14. The apparatus of claim 2, wherein the first dielectric layer is approximately 2 nanometers to 10 nanometers thick.

15. The apparatus of claim 2, wherein the first dielectric layer is at least one of $SiO_2$ and $Al_2O_3$.

16. The apparatus of claim 3, wherein the second dielectric layer is approximately 10 nanometers to 100 nanometers thick.

17. The apparatus of claim 3, wherein the second dielectric layer is at least one of $SiO_2$ and $Al_2O_3$.

* * * * *